United States Patent
Archer et al.

(10) Patent No.: US 12,431,843 B2
(45) Date of Patent: Sep. 30, 2025

(54) FREQUENCY COMPENSATION IN AMPLIFIERS WITH LOCAL-FEEDBACK BUFFER STAGES

(71) Applicant: TEXAS INSTRUMENTS INCORPORATED, Dallas, TX (US)

(72) Inventors: Tyler James Archer, Vail, AZ (US); Bharath Karthik Vasan, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 499 days.

(21) Appl. No.: 18/070,940

(22) Filed: Nov. 29, 2022

(65) Prior Publication Data

US 2024/0186951 A1 Jun. 6, 2024

(51) Int. Cl.
 *H03F 1/02* (2006.01)
 *H03F 1/32* (2006.01)
 *H03F 3/04* (2006.01)

(52) U.S. Cl.
 CPC ............ *H03F 1/0205* (2013.01); *H03F 1/32* (2013.01); *H03F 3/04* (2013.01)

(58) Field of Classification Search
 CPC . H03F 1/0205; H03F 1/32; H03F 3/04; H03F 3/45273; H03F 3/30
 USPC ......................................... 330/291, 267, 255
 See application file for complete search history.

(56) References Cited

U.S. PATENT DOCUMENTS

| | | | |
|---|---|---|---|
| 5,546,045 A * | 8/1996 | Sauer ................... | H03F 3/45224 327/78 |
| 7,362,176 B2 * | 4/2008 | Carreto ............... | H03F 3/45174 330/267 |
| 7,411,455 B2 | 8/2008 | Smith | |

OTHER PUBLICATIONS

U.S. Appl. No. 17/462,930, "Control of Base Currents for Output Driver Transistors in Amplifiers", filed Aug. 31, 2021.

* cited by examiner

*Primary Examiner* — Hieu P Nguyen
(74) *Attorney, Agent, or Firm* — Mandy Barsilai Fernandez; Frank D. Cimino

(57) ABSTRACT

Examples of circuits, amplifiers, and stages thereof are provided that improve amplifier stability margins while maintaining signal fidelity. Example structures include pre-driver circuitry; a compensation node exhibiting high impedance during operation; a feedforward driver coupled to the pre-driver circuitry; and first and second signal mirrors; and first and second output drivers, each having a control terminal. Example structures further include feedforward circuitry in which a first node thereof is coupled to the output of the feedforward driver, a second node thereof is coupled to the control terminal of the first output driver, and a third node thereof is coupled to the control terminal of the second output driver; and compensation circuitry in which a first node thereof is coupled to the compensation node, a second node thereof is coupled to a first internal node of the first signal mirror, and a third node thereof is coupled to a second internal node of the second signal mirror.

23 Claims, 8 Drawing Sheets

FREQUENCY COMPENSATION IN AMPLIFIERS WITH LOCAL-FEEDBACK BUFFER STAGES

FIELD OF DISCLOSURE

This disclosure relates generally to frequency and phase delay compensation in amplifiers, and more particularly to reducing phase delay in local feedback voltage buffer stages of amplifiers, and adjusting the amplifier frequency response according to a local feedback parameter.

BACKGROUND

Conventional amplifiers with local feedback voltage buffer stages tend to suffer from degraded stability margins due to signal phase delay through local feedback circuitry, making such amplifiers more prone to instability. Another drawback of local-feedback architectures in some conventional voltage buffer stages is the dependence of local feedback loop gain on stage output current drive, which can cause margins to further degrade as output drive increases, compounding the risk of instability.

Various solutions to these issues have been proposed. Some solutions to the issue of high signal phase delay through local feedback circuitry bypass this circuitry using feedforward capacitors connected to low-drive signal nodes. However, this results in signal-path current being used to drive the capacitors, undesirably increasing signal distortion.

Solutions to the issue of output current drive dependence employ large $g_m$-setting fixed resistors in the feedback paths such that increased transistor transconductances due to increased feedback currents do not significantly increase overall local feedback loop transconductances as a proportion of their quiescent levels. This approach, however, results in low feedback loop gain, which increases DC error and signal distortion. Other solutions use high transistor quiescent bias currents such that increased feedback currents due to increasing output current drive do not significantly increase transistor transconductances as a proportion of their quiescent levels. This approach, however, results in undesirable high-power dissipation. Still other solutions use capacitors attached to feedback circuitry nodes to help roll off loop gain. This approach results in low AC loop gain, which increases signal distortion.

A better solution to these issues is desirable, and in this context embodiments of the invention arise.

SUMMARY

In an example, a circuit includes pre-driver circuitry; a compensation node; a feedforward driver having an output; first and second signal mirrors; first and second output drivers having respective control terminals; feedforward circuitry; and compensation circuitry. The feedforward driver is coupled to the pre-driver circuitry. A first node of the feedforward circuitry is coupled to the output of the feedforward driver, a second node of the feedforward circuitry is coupled to the control terminal of the first output driver, and a third node of the feedforward circuitry is coupled to the control terminal of the second output driver. A first node of the compensation circuitry is coupled to the compensation node, a second node of the compensation circuitry is coupled to a first internal node of the first signal mirror, and a third node of the compensation circuitry is coupled to a second internal node of the second signal mirror.

In an example, a circuit includes pre-driver circuitry; a feedforward driver; first and second signal mirrors; first and second output transistors each having a control terminal; and first and second feedforward capacitors. The feedforward driver includes first and second driver transistors, each having a control terminal and first and second current terminals. The control terminal of each of the first and second driver transistors is coupled to the pre-driver circuitry, and the first current terminals of the first and second driver transistors are coupled together to form an output of the feedforward driver. The first feedforward capacitor is coupled between the output of the feedforward driver and the control terminal of the first output transistor. The second feedforward capacitor is coupled between the output of the feedforward driver and the control terminal of the second output transistor.

In an example, a circuit includes a compensation node; first and second signal mirrors; and first and second compensation capacitors. The first signal mirror includes first and second mirror transistors, each having a control terminal and first and second current terminals. The control terminals of the first and second mirror transistors and the second current terminal of the first mirror transistor are coupled together to form a first terminal of the first signal mirror, and the second current terminal of the second mirror transistor forms a second terminal of the first signal mirror. The second signal mirror includes third and fourth mirror transistors, each having a control terminal and first and second current terminals. The control terminals of the third and fourth mirror transistors and the second current terminal of the third mirror transistor are coupled together to form a first terminal of the second signal mirror, and the second current terminal of the fourth mirror transistor forms a second terminal of the second signal mirror. The first compensation capacitor is coupled between the compensation node and the first current terminal of the first mirror transistor, and the second compensation capacitor is coupled between the compensation node and the first current terminal of the third mirror transistor.

In an example, an amplifier includes pre-driver circuitry; a compensation node; first and second feedback loops; feedforward circuitry; and first and second compensation capacitors. The first feedback loop extends from an output of the amplifier, through a resistive element coupled to the output of the amplifier, through a first current path in a first signal mirror having first and second terminals, and through a first output driver of the amplifier. The second feedback loop extending from the output of the amplifier, through the resistive element, through a second current path in a second signal mirror having first and second terminals, and through a second output driver of the amplifier. The feedforward circuitry includes a feedforward driver coupled to the pre-driver circuitry, the driver having an output, the feedforward circuitry further including a first feedforward capacitor coupled between the output of the feedforward driver and a first control terminal of the first output driver, and a second feedforward capacitor coupled between the output of the feedforward driver and a second control terminal of the second output driver. The first compensation capacitor is coupled between the compensation node and an input-degeneration node of the first signal mirror, and the second compensation capacitor is coupled between the compensation node and an input-degeneration node of the second signal mirror.

These and other features will be better understood from the following detailed description with reference to the accompanying drawings.

BRIEF DESCRIPTION OF THE DRAWINGS

Features of the disclosure may be understood from the following figures taken in conjunction with the detailed description.

DETAILED DESCRIPTION

Figure 1:
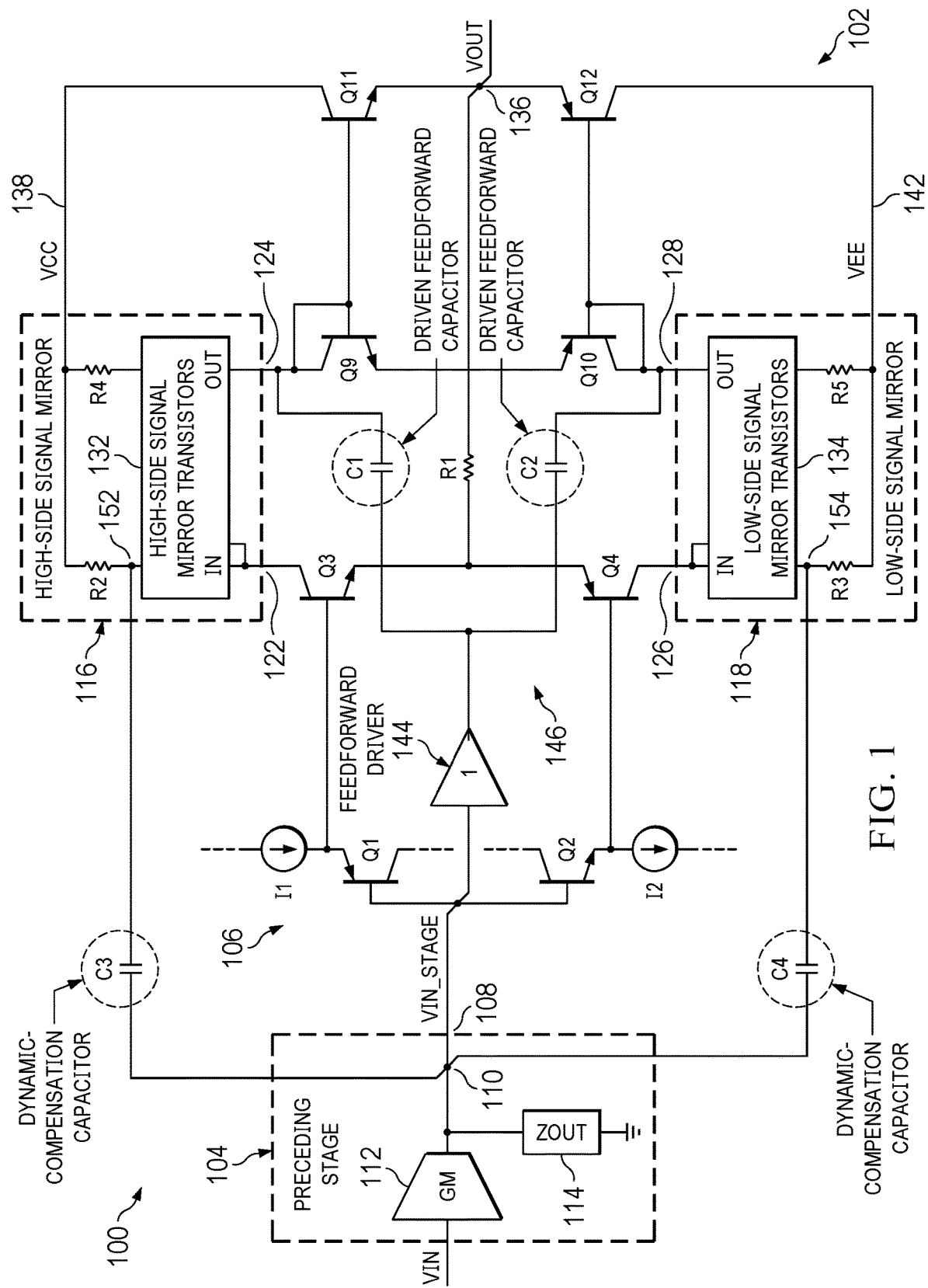
FIG. 1 is a circuit diagram of an example multi-stage amplifier, including an example voltage buffer stage with local feedback, in which the stage includes example feedforward driver and capacitance circuitry, as well as example dynamic compensation capacitance circuitry.

Specific examples are described below in detail with reference to the accompanying figures. These examples are not intended to be limiting. In the drawings, corresponding numerals and symbols generally refer to corresponding parts unless otherwise indicated. The objects depicted in the drawings are not necessarily drawn to scale.

Example amplifiers and stages thereof are provided that improve amplifier stability margins while maintaining signal fidelity. Stability margins are maintained without the need to reduce local feedback loop gain or increase bias current levels. This advantageously leads to low distortion, high DC precision, low open-loop output impedance, and low power consumption. In an example buffer output stage, a high-drive feedforward driver produces a voltage at its output that follows the stage input voltage and provides driving currents for a pair of feedforward capacitors. One such capacitor is coupled between the feedforward driver output and the control terminal of the buffer stage's first output driver. The other feedforward capacitor is coupled between the feedforward driver output and the control terminal of the buffer stage's second output driver. First and second dynamic compensation capacitors each have one end coupled to a compensation node, which is a high-impedance node of the amplifier and which may be the output of a preceding stage. The other end of the first dynamic compensation capacitor is coupled to an input-degeneration node of the buffer stage's first signal mirror, and the other end of the second dynamic compensation capacitor is coupled to an input-degeneration node of the buffer stage's second signal mirror.

FIG. 1 is a circuit diagram of stages (or portions) of an example amplifier 100. Stage 102 may be an output voltage buffer stage with local feedback, and stage 104 is an example preceding stage. Amplifier 100 may include additional stages (not shown). Stage 102 includes pre-driver circuitry 106. In an example, pre-driver circuitry 106 includes a p-type bipolar junction transistor (PNP transistor) Q1 and an n-type bipolar junction transistor (NPN transistor) Q2 with their bases coupled together to form an input 108 of pre-driver circuitry 106 and stage 102. Input 108 is configured to receive an input voltage (VIN_STAGE). The output of a first current source I1 is coupled to the emitter of PNP pre-driver transistor Q1, and the input of a second current source I2 is coupled to the emitter of NPN pre-driver transistor Q2. The collectors of Q1 and Q2 are coupled to unspecified nodes, which may be the same or different and which may vary for different configurations. Similarly, the input of I1 and the output of I2 may be coupled according to a specific configuration.

Input 108 is coupled to a compensation node 110, which is a high-impedance node and may be the output of preceding stage 104, as shown in FIG. 1. Preceding stage 104 further includes a transconductance element 112 having an input at which a voltage (VIN) is input and has an output impedance that is represented by impedance element 114 coupled between compensation node 110 and ground, which may be small-signal ground. The output impedance of preceding stage 104 is denoted ZOUT. The gain of preceding stage may be represented as the product of the transconductance of transconductance element 112 (gm) and ZOUT.

The emitters of transistors Q1 and Q2 are coupled to control terminals (e.g., bases) of signal-conveyance transistors Q3 and Q4, respectively. In an example, Q3 is an NPN transistor, and Q4 is a PNP transistor with their emitters coupled together.

Stage 102 further includes a high-side signal mirror 116 and a low-side signal mirror 118, each of which may be a current mirror. High-side signal mirror 116 has an input terminal 122 coupled to the collector of Q3, and an output terminal 124. Similarly, low-side signal mirror 118 has an input terminal 126 coupled to the collector of Q4, and an output terminal 128. Each of the input terminals is also denoted IN and each output terminal is also denoted OUT. The input and output terminals 122 and 124, respectively, are formed by high-side signal mirror transistors, generally identified by reference numeral 132 in FIG. 1, and which may include transistors Q5 and Q7 (shown in other figures). Low-side signal mirror transistors 134, which may include transistors Q6 and Q8 (shown in other figures), form input and output terminals 126 and 128, respectively.

Various resistive elements, e.g., resistors, are included in stage 102. Resistor R1 is coupled between the common emitter coupling of transistors Q3 and Q4 and an output 136 of stage 102. Resistors R2 and R4 form part of high-side signal mirror 116 and are coupled between high-side mirror transistors 132 and a first supply terminal 138, which is configured to be coupled to a first supply, e.g., voltage supply VCC. Resistors R3 and R5 form part of low-side signal mirror 118 and are coupled between low-side transistors 134 and a second supply terminal 142, which is configured to be coupled to a second supply, e.g., voltage supply VEE.

Output terminals 124 and 128 of high- and low-side signal mirrors 132 and 134 are respectively coupled to the collectors of transistors Q9 and Q10. Each of Q9 and Q10 is configured with its base coupled to its collector. The emitters of Q9 and Q10 are commonly coupled. In an example, Q9 is an NPN transistor, and Q10 is a PNP transistor.

Stage 102 further includes a pair of output-driver transistors Q11 and Q12, which have their emitters coupled together to form output 136. The base of Q11 is coupled to the common base-collector coupling of Q9, and the base of Q12 is coupled to the common base-collector coupling of Q10. The collector of Q11 is coupled to first supply terminal 138 and to resistors R2 and R4, and the collector of Q12 is coupled to second supply terminal 142 and to resistors R3 and R5. In an example, Q11 is an NPN transistor, and Q12 is a PNP transistor. Transistors Q9 and Q10 form an impedance element that assists in biasing output-driver transistors Q11 and Q12. The impedance element may be implemented in other ways.

Resistor R1, transistor Q3, high-side signal mirror 116, and transistors Q9 and Q11 form a high-side feedback loop. Resistor R1, transistor Q4, low-side signal mirror 118, and transistors Q10 and Q12 form a low-side feedback loop. Local feedback loops, such as these, are commonly employed to improve DC precision and reduce signal distortion in an amplifier. There are drawbacks to using such feedback loops, however. One such drawback is increased signal phase delay through the stage, which can make the amplifier more prone to instability.

To reduce phase delay and improve stability of amplifier 100, stage 102 includes a feedforward driver 144 and feedforward circuitry 146. In an example, feedforward circuitry 146 includes first and second feedforward capacitors C1 and C2, each of which is coupled to the output of feedforward driver 144, which may also be considered part of feedforward circuitry 146. The input of feedforward driver 144 is coupled to pre-driver circuitry 106. In operation, feedforward driver 144 produces a voltage at its output that follows the stage input voltage (VIN_STAGE) and provides high driving currents for feedforward capacitors C1 and C2 without compromising signal integrity.

The other end of feedforward capacitor C1 is coupled to the base of output-driver transistor Q11, which in the illustrated example is also the node formed by output terminal 124 of high-side signal mirror 116 and the collector-base coupling of transistor Q9. The other end of feedforward capacitor C2 is coupled to the base of output-driver transistor Q12, which in the illustrated example is also the node formed by output terminal 128 of low-side signal mirror 118 and the collector-base coupling of transistor Q10. With this configuration in which C1 is coupled directly to the base of Q11 to bypass high-side signal mirror 116 and C2 is coupled directly to the base of Q12 to bypass low-side signal mirror 118, signal is fed more directly from input 108 to the bases of Q11 and Q12 and phase delay in stage 102 is reduced, thus improving amplifier stability margins.

In another implementation, there is additional circuitry in the signal path between signal mirror outputs 124 and 128 and the bases of output-driver transistors Q11 and Q12. In this implementation, feedforward capacitors C1 and C2 would, optimally, be coupled to the bases of output-driver transistors Q11 and Q12, respectively, but not necessarily to signal mirror outputs 124 and 128, respectively. Alternatively, in less optimal arrangement, C1 and C2 may be directly coupled to outputs 124 and 128, respectively and coupled indirectly to the bases of the output-driver transistors Q11 and Q12, respectively, through the additional circuitry.

Stage 102 further includes dynamic compensation circuitry in which a first node is coupled to compensation node 110, e.g., the output of preceding stage 104, a second node is coupled to an internal node 152 of high-side signal mirror 116, and a third node is coupled to an internal node 154 of low-side signal mirror 118. In an example, the dynamic compensation circuitry includes dynamic compensation capacitors C3 and C4. C3 is coupled between compensation node 110 and internal node 152, and C4 is coupled between compensation node 110 and internal node 154. In an example, the internal nodes are input-degeneration nodes of high- and low-side signal mirrors 116 and 118, respectively. As so coupled, C3 and C4 comprise all or part of the compensation capacitance at compensation node 110.

In the illustrated example, compensation node 110 is coupled directly to input 108 of pre-driver circuitry 106, although this need not be the case. In other implementations, additional circuitry or stages may be present between compensation node 110 and pre-driver circuitry 106.

The coupling of C3 and C4 between compensation node 110 and internal nodes 152 and 154 of signal mirrors 116 and 118, respectively, gives each of C3 and C4 a series impedance that changes with the level of feedback current in its corresponding signal mirror 116/118, causing the amplifier frequency response to be dynamically adjusted as buffer-stage feedback current changes. This effect, along with the influences of C3 and C4 on the frequency characteristics of the signal mirror gains, results in high stability margins being maintained across output-drive conditions.

Figure 2:
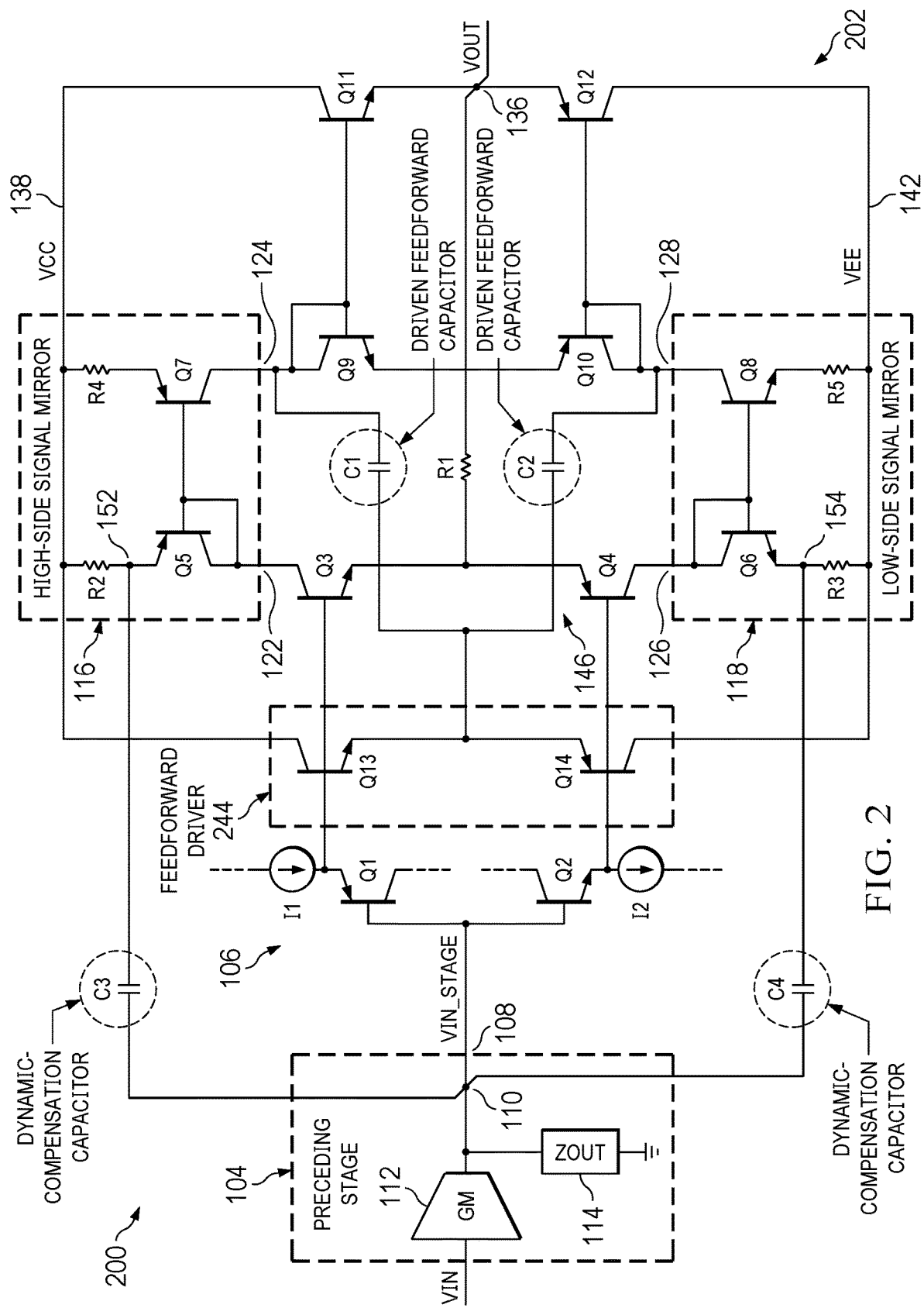
FIG. 2 is a circuit diagram similar to that of FIG. 1, showing an example implementation of the feedforward driver and capacitance circuitry, as well as an example implementation of the high- and low-side signal mirrors used in the local-feedback voltage buffer stage.

The coupling of dynamic compensation capacitors C3 and C4 to internal nodes 152 and 154 of high- and low-side signal mirrors 116 and 118, respectively, is shown in more detail in FIG. 2, which shows an example implementation of high-side signal mirror transistors 132 and low-side signal mirror transistors 134. In local-feedback stage 202 of amplifier 200, high-side signal mirror transistors 132 include transistors Q5 and Q7, each of which may be a PNP transistor. Low-side signal mirror transistors 134 includes transistors Q6 and Q8, each of which may be an NPN transistor.

Transistors Q5 and Q7 are configured with their bases coupled together. The collector of Q5, which is also coupled to the common base coupling, forms input terminal 122 of high-side signal mirror 116, and its output is formed by the collector of Q7. One end of resistor R2 is coupled to the emitter of Q5, which coupling forms internal node 152, which is an input-degeneration node of high-side signal mirror 116. Dynamic compensation capacitor C3 is coupled to this input-degeneration node. The other end of resistor R2 is coupled to first supply terminal 138. Resistor R4 is coupled between the emitter of Q7 and first supply terminal 138.

Transistors Q6 and Q8 are also configured with their bases coupled together, with the collector of Q6 also coupled to that common base coupling. The collector of Q6 forms input terminal 126 of low-side signal mirror 118, and its output is formed by the collector of Q8. One end of resistor R3 is coupled to the emitter of Q6, which coupling forms internal node 154, which is an input-degeneration node of low-side signal mirror 118. Dynamic compensation capacitor C4 is coupled to this input-degeneration node. The other end of resistor R3 is coupled to second supply terminal 142. Resistor R5 is coupled between the emitter of Q8 and second supply terminal 142.

FIG. 2 also shows an example implementation of feedforward driver 144. In the illustrated example of FIG. 2, feedforward driver 244, comprised of an NPN/PNP pair of transistors Q13 and Q14, respectively, is implemented as a high-drive second diamond-buffer output branch connected to the emitters of pre-driver transistors Q1 and Q2. The base of NPN transistor Q13 is coupled to the emitter of transistor Q1 and to the base of signal-conveyance transistor Q3. The base of PNP transistor Q14 is coupled to the emitter of transistor Q2 and to the base of signal-conveyance transistor Q4. The emitters of Q13 and Q14 are coupled together to form the output of feedforward driver 244. The collectors of Q13 and Q14 are coupled to first and second supply terminals 138 and 142, respectively.

Other elements of FIG. 2 are the same or substantially the same as their respective counterparts in FIG. 1, and thus are identified by the same reference numerals and not further described here.

Since the local feedback loops regulate the signal mirror output currents, i.e., the collector currents of Q7 and Q8, such that they are fixed for a given output drive current condition, the base node voltages of Q7 and Q8 are therefore also regulated such that they are fixed. Thus, these nodes, which are also the base/collector nodes of Q5 and Q6 respectively, behave as small-signal grounds within the bandwidth of the local feedback loops.

Looking into high- and low-side signal mirrors 116 and 118, dynamic compensation capacitors C3 and C4 see small-signal impedances approximately equal to $$R2 // \frac{1}{g_{m\_Q5}} \text{ and } R3 // \frac{1}{g_{m\_Q6}}$$

respectively, where the $g_m$ terms are the small-signal transconductances of Q5 and Q6. Since each $g_m$ is proportional to the large-signal emitter current of the corresponding transistor, the effective impedance in series with each dynamic compensation capacitor C3 and C4 decreases as local-feedback current in the corresponding signal mirror increases. This dynamic adjustment of amplifier compensation contributes to high stability margins being maintained across output-drive conditions.

Figure 3:
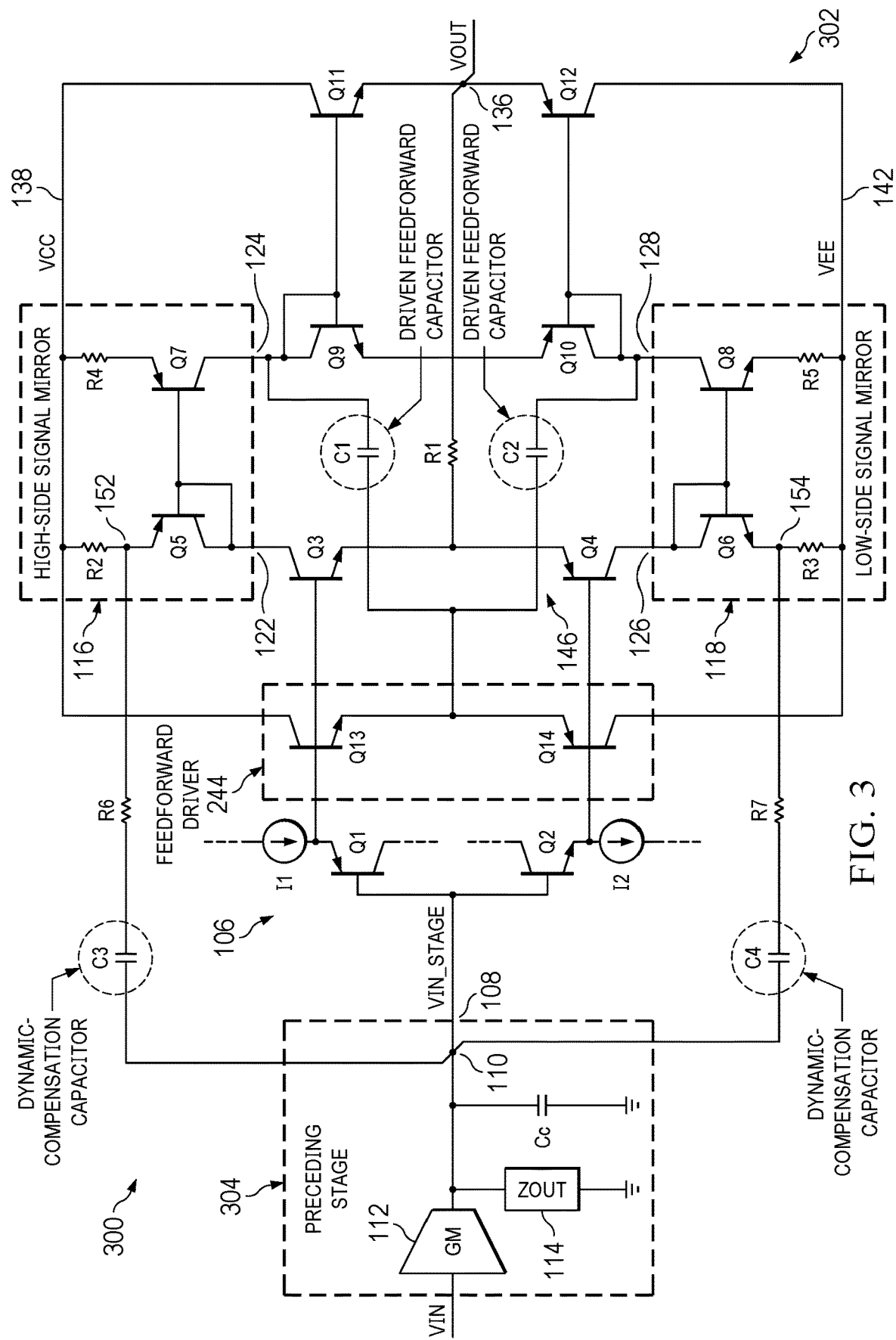
FIG. 3 is a circuit diagram similar to that of FIG. 2, showing another example of the dynamic compensation capacitance circuitry.

FIG. 3 is a circuit diagram similar to that of FIG. 2, showing another example of the dynamic compensation capacitance circuitry. Elements in FIG. 3 that are the same or substantially the same as their respective counterparts in FIG. 2 are identified by the same reference numerals. The description below focuses on the differences of the circuit of FIG. 3 with respect to that of FIG. 2.

In amplifiers 100 and 200 of FIGS. 1 and 2, respectively, all or substantially all of the compensation capacitance of preceding stage 104 is coupled to high- and low-side signal mirrors 116 and 118, respectively. In amplifier 300 shown in FIG. 3, only a portion of the compensation capacitance of preceding stage 304 is coupled to high- and low-side signal mirrors 116 and 118. The remaining portion, represented by a static compensation capacitor Cc, is coupled directly to small-signal ground. This moderates the effects of changing dynamic compensation capacitor series impedances on amplifier frequency response.

The dynamic compensation capacitance circuitry of local-feedback stage 302 of amplifier 300 is also different than that of stages 102 and 202. Resistors R6 and R7 are placed in series with dynamic compensation capacitors C3 and C4, respectively. This modifies the effective series impedances seen looking into high- and low-side signal mirrors 116 and 118 from C3 and C4 to become $$R6 + R2 // \frac{1}{g_{m\_Q5}} \text{ and } R7 + R3 // \frac{1}{g_{m\_Q6}},$$

respectively. These fixed series resistances can be sized to tune the amplifier compensation and obtain the desired frequency response. The series coupling of C3 and R6 and the series coupling of C4 and R7 are not limited to the specific coupling shown in FIG. 3. R6 may be coupled between compensation node 110 and C3, and R7 may be coupled between compensation node 110 and C4.

Figure 4:
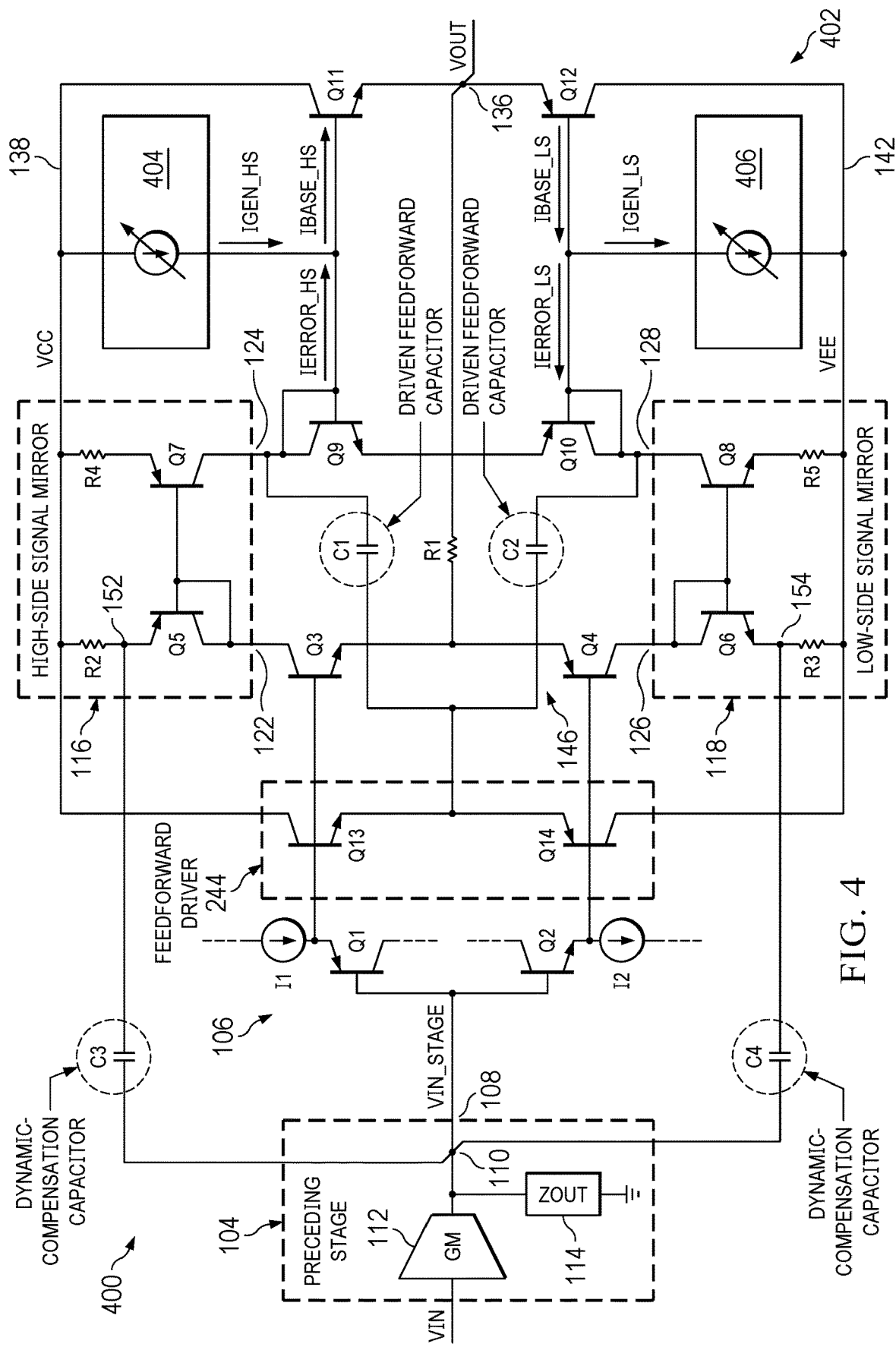
FIG. 4 is a circuit diagram similar to that of FIG. 2, further including example high- and low-side base current generation circuits.

FIG. 4 is a circuit diagram similar to that of FIG. 2, further including example high- and low-side base current generation circuits. The description below focuses on the differences of the circuit of FIG. 4 with respect to that of FIG. 2. In this example, local-feedback stage 402 of amplifier 400 includes high-side base current generation circuit 404 coupled between first supply terminal 138 and the common base coupling of transistors Q9 and Q11, and low-side base current generation circuit 406 coupled between the common base coupling of transistors Q10 and Q12 and second supply terminal 142.

In the implementation of FIG. 4, frequency compensation is executed along with circuits 404 and 406 that produce currents IGEN_HS and IGEN_LS, respectively. IGEN_HS and IGEN_LS are generated to match, or substantially match, the base currents IBASE_HS and IBASE_LS of output-driver transistors Q11 and Q12, respectively. With this configuration, rather than having to provide output driver base currents, the feedback loops only have to supply small residual error currents IERROR_HS and IERROR_LS, where IERROR_HS≅IBASE_HS−IGEN_HS and IERROR_LS≅IBASE_LH−IGEN_LS. This reduces the change in feedback current with respect to change in amplifier output current drive, further reducing degradation of stability margins with increasing output current drive magnitude.

Figure 5:
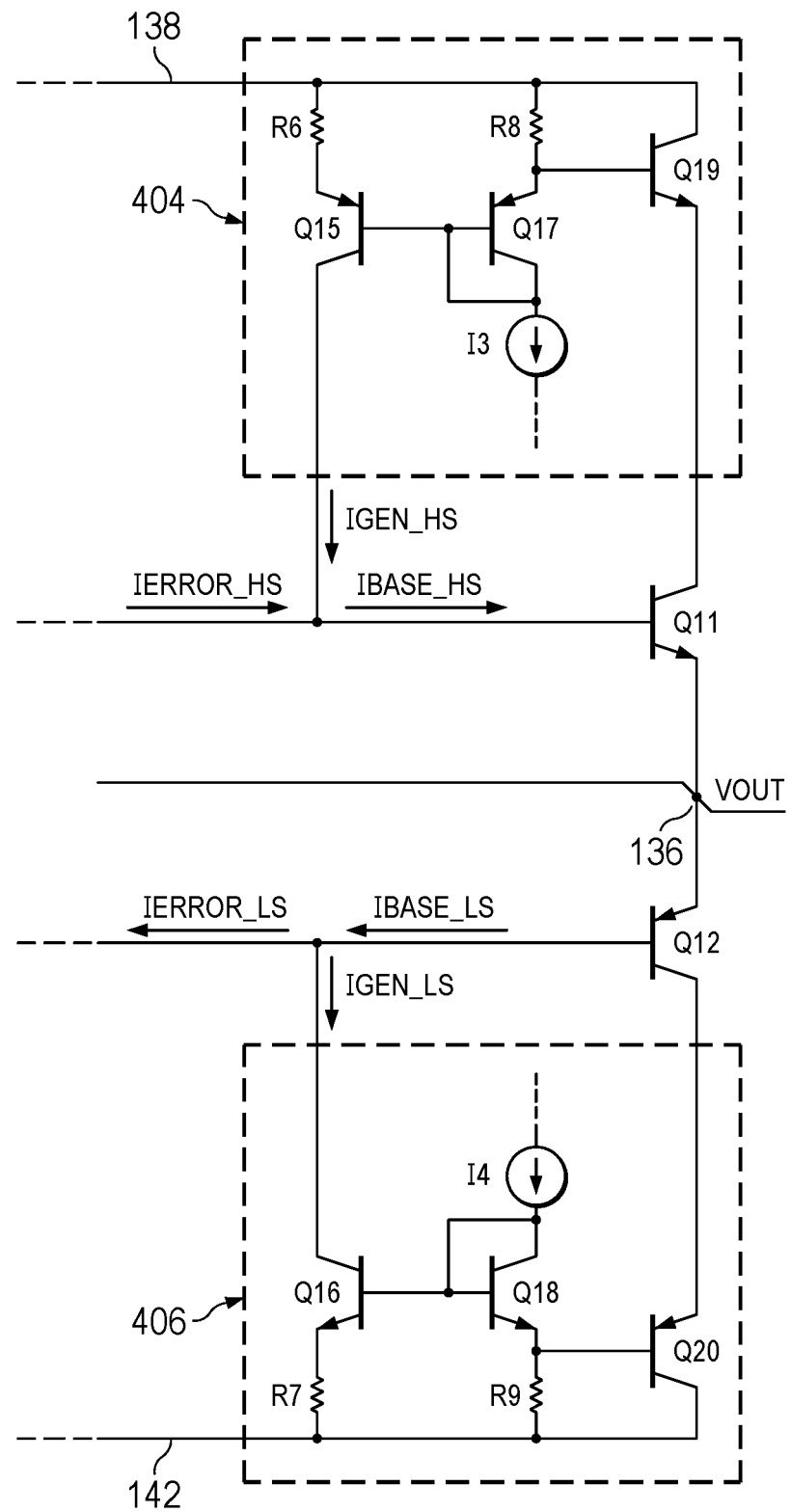
FIG. 5 is a circuit diagram showing an example implementation of the high- and low-side base current generation circuits of FIG. 4.

FIG. 5 shows an example implementation of high- and low-side base current generation circuits 404 and 406. Each circuit 404 and 406 is configured with three transistors, two resistors and a current source. Such circuits may be implemented according to the teachings in co-pending application Ser. No. 17/462,930, filed Aug. 31, 2021, entitled "Control of Base Currents for Output Driver Transistors in Amplifiers." The content of this co-pending application is incorporated by reference herein in its entirety.

In the example of FIG. 5, high-side base current generation circuit 404 includes PNP transistors Q15 and Q17, as well as NPN transistor Q19. Resistors R6 and R8 are coupled between first supply terminal 138 and the emitters of Q15 and Q17, respectively. The bases of Q15 and Q17 are coupled together and also coupled to the collector of Q17 and a current source I3. The collector of Q15 is coupled to the common base coupling of transistors Q9 and Q11. Q19 has a base coupled to the emitter of Q17, a collector coupled to first supply terminal 138, and an emitter coupled to the collector of output-driver transistor Q11.

In the example of FIG. 5, low-side base current generation circuit 406 includes NPN transistors Q16 and Q18, as well as PNP transistor Q18. Resistors R7 and R9 are coupled between second supply terminal 142 and the emitters of Q16 and Q18, respectively. The bases of Q16 and Q18 are coupled together and also coupled to the collector of Q18 and a current source I4. The collector of Q16 is coupled to the common base coupling of transistors Q10 and Q12. Q20 has a base coupled to the emitter of Q18, a collector coupled to second supply terminal 142, and an emitter coupled to the collector of output-driver transistor Q12.

In an example implementation of circuits 404 and 406 in stage 402 with local feedback, replicas of the base currents of Q11 and Q12 are produced at the bases of Q19 and Q20, respectively, and are mirrored to the base nodes of Q11 and Q12, accurately supplying their base currents and resulting in only small residual error currents.

Figure 6A:
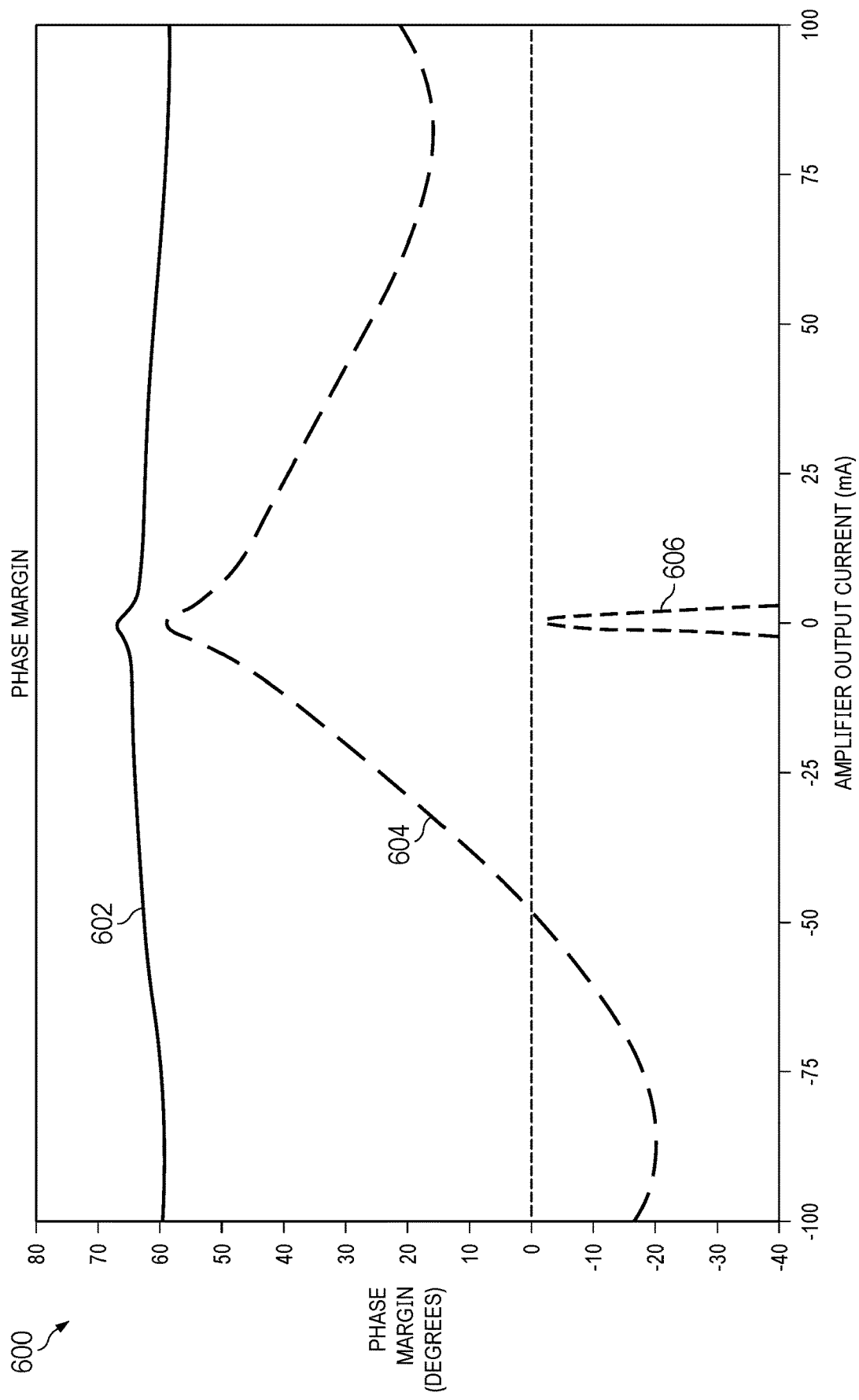
FIGS. 6A and 6B show graphs illustrating phase margin and gain margin improvements provided by an example local-feedback voltage buffer configured substantially as shown in FIG. 3.
Figure 6B:
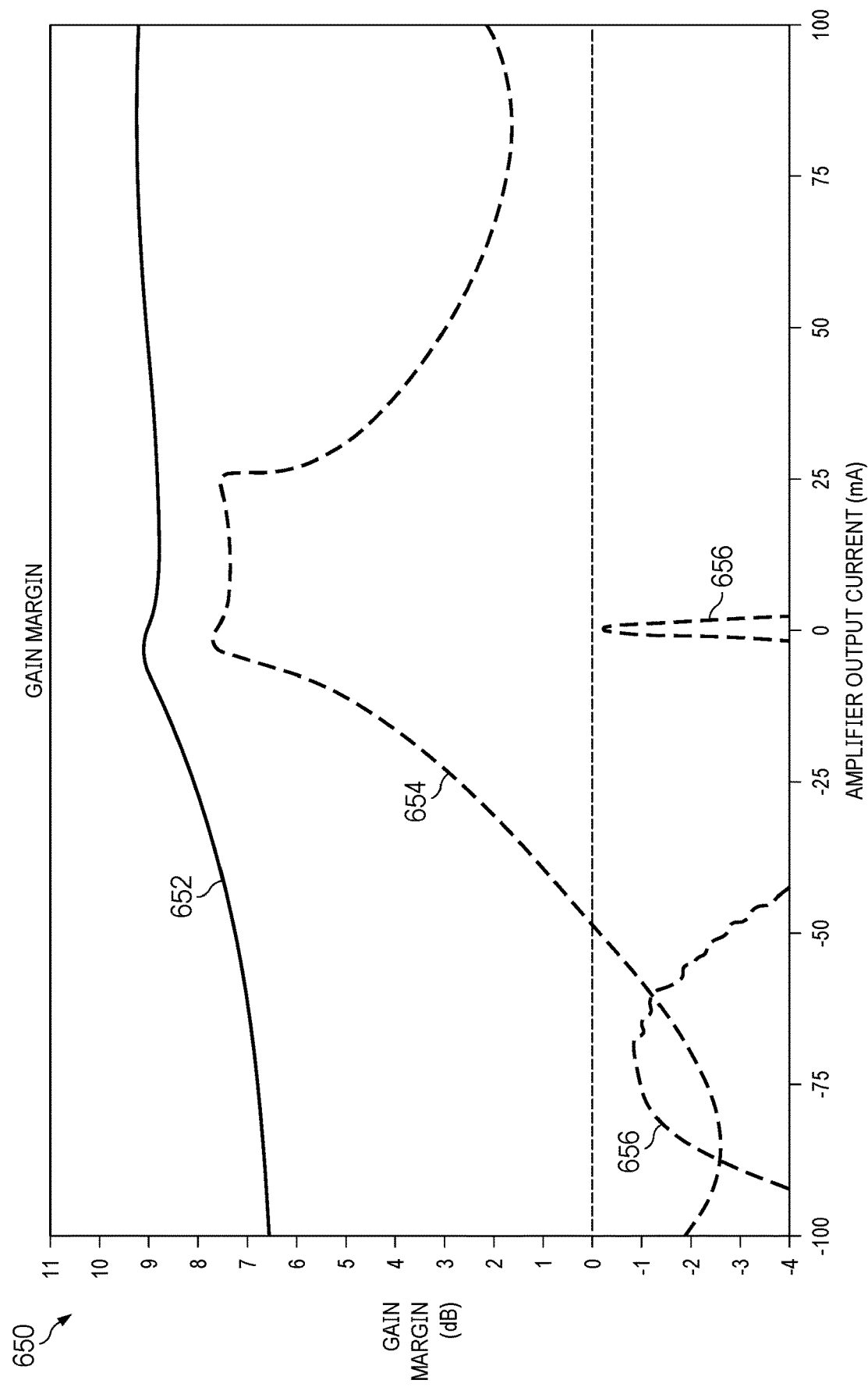

FIGS. 6A and 6B show graphs illustrating performances of amplifiers including a local feedback stage configured in three different ways: (1) with feedforward circuitry and dynamic compensation circuitry, i.e., substantially as shown in FIG. 3; (2) with the feedforward circuitry of FIG. 3 only; and (3) with neither the feedforward circuitry nor the dynamic compensation circuitry of FIG. 3. Graph 600 of FIG. 6A shows phase margin (degrees) with respect to amplifier output current (mA) for these three configurations, with curve 602 representing configuration (1), curve 604 representing configuration (2), and curve 606 representing configuration (3). Graph 650 of FIG. 6B shows gain margin (dB) with respect to amplifier output current (mA) for these three configurations, with curve 652 representing configuration (1), curve 654 representing configuration (2), and curve 656 representing configuration (3).

Without either part of the solution described herein, i.e., configuration (3), the amplifier is unstable and would require measures that degrade bandwidth, slew rate, distortion performance, output impedance, and/or DC precision to stabilize. With driven feedforward capacitors in place, i.e., configuration (2), the amplifier is stable under low-drive conditions, but degradation of stability margins occurs as output current drive increases. With both driven feedforward capacitors and dynamic compensation capacitors in place, i.e., configuration (1), high stability margins are maintained across output current drive conditions.

Figure 7:
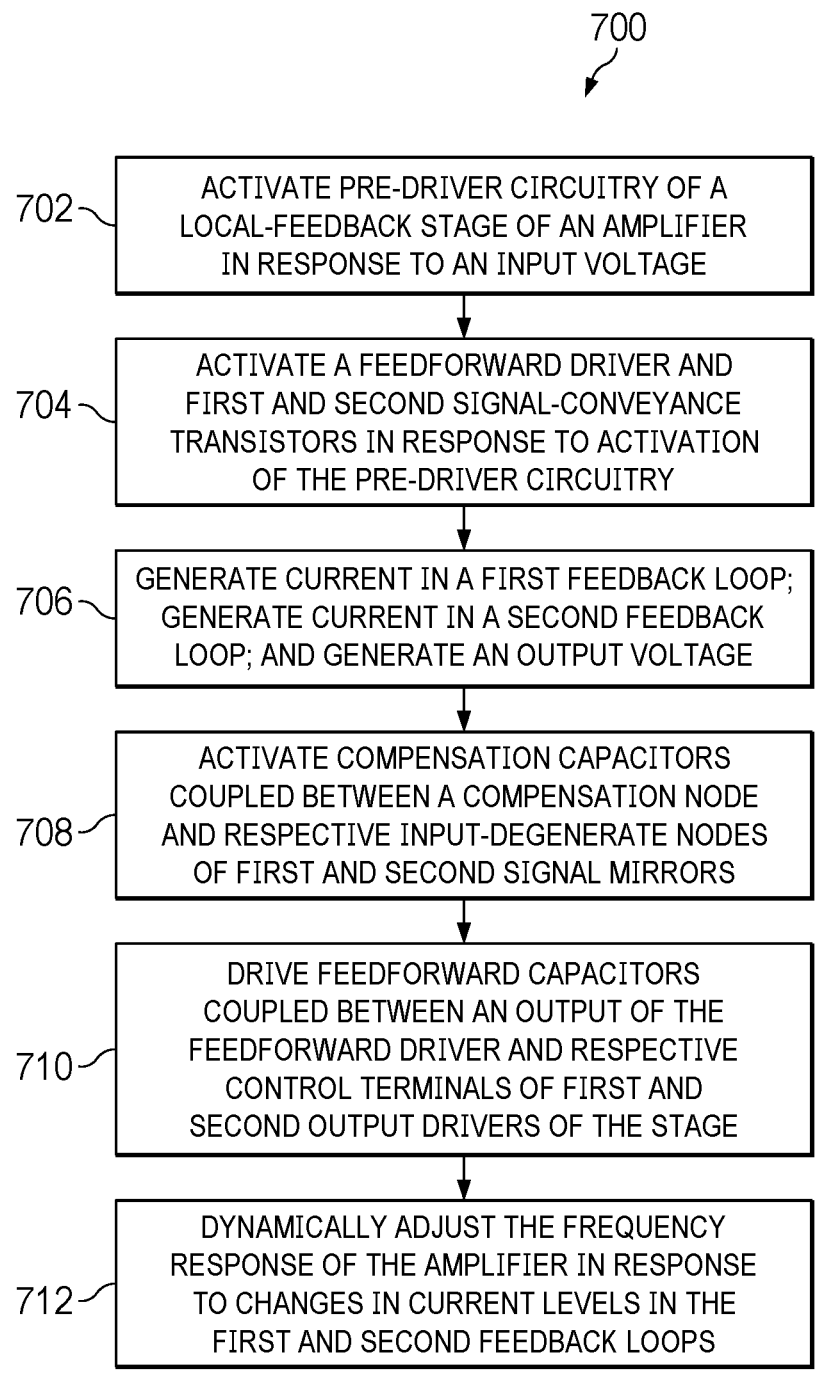
FIG. 7 is a flow diagram of an example method of operating example feedforward drive and capacitance circuitry, as well as operating dynamic compensation circuitry in an example amplifier stage with local feedback.

FIG. 7 is a flow diagram of an example method 700 of operating feedforward circuitry and compensation circuitry in the context of a local-feedback stage of an amplifier, e.g., an output voltage buffer stage with local feedback. In operation 702, pre-driver circuitry of the stage is activated in response to a voltage input to the stage. In response, a feedforward driver and first and second signal-conveyance transistors are activated in operation 704. This generates currents in first and second feedback loops, respectively, and also generates an output voltage of the stage (operation 706). The stage includes first and second feedforward capacitors coupled between an output of the feedforward driver and respective control terminals of first and second output drivers of the stage, as well as first and second dynamic compensation capacitors coupled between a compensation node of the amplifier (which node may be the output of the preceding stage) and respective input-degenerate nodes of first and second signal mirrors. In operation 708, these dynamic compensation capacitors are activated, and in operation 710, these feedforward capacitors are driven. Doing so, dynamically adjusts the frequency response of the amplifier in response to changes in current levels in the first and second feedback loops (operation 712).

FIG. 7 depicts one possible order of operations. Not all operations need necessarily be performed in the order described. Some operations may be performed at substantially the same time. Some operations may be combined into a single operation. Additional operations and/or alternative operations may be performed.

Various example amplifier stages with local feedback, e.g., output buffer stages with local feedback, having improved phase and gain margins are disclosed. Feedforward capacitors, driven by a feedforward driver, bypass local-feedback circuitry to reduce phase delay in such amplifier stage, making the amplifier less prone to instability. Dynamic compensation capacitors coupled between a compensation node, e.g., the high-impedance node of a preceding stage, and signal mirrors of the local-feedback buffer stage dynamically adjust the amplifier frequency response according to local feedback current level, reducing degradation of amplifier stability margins due to changes in buffer stage output current drive.

Solutions provided herein have a wide range of applications in amplifiers utilizing buffer stages with local feedback loops. Rather than relying on low-drive signal nodes for feedforward capacitor drive, the driven feedforward capacitors disclosed herein have a separate feedforward driver, allowing such capacitors to improve amplifier stability margins without increasing signal distortion. Moreover, rather than limiting local loop gain or relying on large bias currents to reduce sensitivity of stability margins to output current drive, the dynamic compensation capacitors disclosed herein maintain high stability margins across output-drive conditions while allowing for high local loop gain for low distortion, high DC precision, and low open-loop output impedance, and small bias currents for low power consumption.

Resistance values of various resistors described herein may vary depending on the particular application of the circuit. The supply voltage(s), e.g., VCC and VEE, of the various circuits described herein may be any suitable voltage for the particular application. The current delivered by any of the current sources described herein may be set based on the particular function to be performed. Unless otherwise stated, "about," "approximately," or "substantially" preceding a value means+/−10 percent of the stated value.

As used herein, the terms "terminal" and "node" may be an interconnection, lead and/or pin. Unless specifically stated to the contrary, these terms generally mean an interconnection between or a terminus of a device element, a circuit element, an integrated circuit, a device or other electronic or semiconductor component. The term "control terminal" as used herein refers to the base of an associated BJT, and the term "current terminal" refers to a collector or emitter of an associated BJT.

While the use of bipolar junction transistors (BJTs) is described herein, other types of transistors (or equivalent devices) may be used instead. For example, instead of using n- and p-type BJTs, n-type metal-oxide-silicon field-effect transistors (MOSFETs) may be used instead or in addition to BJTs in the various circuits described. In an example, any or all of transistors Q1-Q8 may be a MOSFET, and each of transistors Q9-Q12 may be a BJT as shown in the figures. In general, in substituting a MOSFET for a BJT, an n-type BJT would be replaced by an n-type MOSFET and a p-type BJT would be replaced by a p-type MOSFET, in which the emitter would correspond to the source, the collector would correspond to the drain, and the base would correspond to the gate.

The term "couple" is used throughout the specification. The term and derivatives thereof may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (i.e. programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors and/or capacitors), and/or one or more sources (such as voltage and/or current sources) may instead include only the semiconductor elements within a single physical device (i.e. a semiconductor die and/or integrated circuit (IC) package) and may be adapted to be coupled to at least some of the passive elements and/or the sources to form the described structure either at a time of manufacture or after a time of manufacture, for example, by an end-user and/or a third-party. Circuits described herein are reconfigurable to include the replaced components to provide functionality at least partially similar to functionality available prior to the component replacement.

Modifications of the described examples are possible, as are other examples, within the scope of the claims. Moreover, features described herein may be applied in other environments and applications consistent with the teachings provided.

What is claimed is:

1. A circuit comprising:
   pre-driver circuitry;
   a compensation node;
   a feedforward driver coupled to the pre-driver circuitry, the feedforward driver having an output;
   first and second signal mirrors;
   first and second output drivers, each having a control terminal;
   feedforward circuitry in which a first node of the feedforward circuitry is coupled to the output of the feedforward driver, a second node of the feedforward circuitry is coupled to the control terminal of the first output driver, and a third node of the feedforward circuitry is coupled to the control terminal of the second output driver; and
   compensation circuitry in which a first node of the compensation circuitry is coupled to the compensation node, a second node of the compensation circuitry is coupled to a first internal node of the first signal mirror, and a third node of the compensation circuitry is coupled to a second internal node of the second signal mirror.

2. The circuit of claim 1, wherein the feedforward circuitry includes:
   a first feedforward capacitor coupled between the output of the feedforward driver and the control terminal of the first output driver; and
   a second feedforward capacitor coupled between the output of the feedforward driver and the control terminal of the second output driver.

3. The circuit of claim 1, wherein the compensation circuitry includes:
   a first compensation capacitor coupled between the compensation node and the first internal node of the first signal mirror; and
   a second compensation capacitor coupled between the compensation node and the second internal node of the second signal mirror.

4. The circuit of claim 1, wherein the feedforward driver includes:
   a first transistor having a control terminal and first and second current terminals;
   a second transistor having a control terminal and first and second current terminals,
   wherein the control terminal of each of the first and second transistors is coupled to the pre-driver circuitry, the second current terminals of the first and second transistors are coupled together and form the output of the feedforward driver.

5. The circuit of claim 1, wherein the circuit is an output buffer stage of an amplifier, and the compensation node is coupled to an output of a preceding stage of the amplifier.

6. The circuit of claim 1, wherein:
   the first signal mirror includes first and second mirror transistors, each having a control terminal and first and second current terminals, the control terminals of the first and second mirror transistors and the second current terminal of the first mirror transistor coupled together to form a first terminal of the first signal mirror, the second current terminal of the second mirror transistor forming a second terminal of the first signal mirror, and the first current terminal of the first mirror transistor corresponding to the first internal node of the first signal mirror; and
   the second signal mirror includes third and fourth mirror transistors, each having a control terminal and first and second current terminals, the control terminals of the third and fourth mirror transistors and the second current terminal of the third mirror transistor coupled together to form a first terminal of the second signal mirror, the second current terminal of the fourth mirror transistor forming a second terminal of the second signal mirror, and the first current terminal of the third mirror transistor corresponding to the second internal node of the second signal mirror.

7. The circuit of claim 6, further comprising:
   a first resistor coupled between a first supply terminal and the first current terminal of the first mirror transistor, the coupling of the first resistor and the first current terminal of the first mirror transistor corresponding to the first internal node of the first signal mirror; and
   a second resistor coupled between a second supply voltage terminal and the first current terminal of the third mirror transistor, the coupling of the second resistor and the first current terminal of the third mirror transistor corresponding to the second internal node of the second signal mirror.

8. The circuit of claim 3, wherein the compensation circuitry further includes:
   a first compensation resistor coupled in series with the first compensation capacitor; and
   a second compensation resistor coupled in series with the second compensation capacitor.

9. A circuit comprising:
   pre-driver circuitry;
   a feedforward driver including first and second driver transistors, each having a control terminal and first and second current terminals, the control terminal of each of the first and second driver transistors coupled to the pre-driver circuitry, and the first current terminals of the first and second driver transistors coupled together to form an output of the feedforward driver;
   first and second signal mirrors, each having first and second terminals;

first and second output transistors, each having a control terminal;

a first feedforward capacitor coupled between the output of the feedforward driver and the control terminal of the first output transistor; and a second feedforward capacitor coupled between the output of the feedforward driver and the control terminal of the second output transistor.

10. The circuit of claim 9, wherein the feedforward driver is configured to provide driving currents for the first and second feedforward capacitors.

11. The circuit of claim 9, further comprising:

first and second signal-conveyance transistors, each having a control terminal and first and second current terminals, the second current terminal of the first signal-conveyance transistor coupled to the first terminal of the first signal mirror, the second current terminal of the second signal-conveyance transistor coupled to the first terminal of the second signal mirror, and the first terminals of the first and second signal-conveyance transistors coupled together, wherein:

the pre-driver circuitry includes a pre-driver p-type bipolar junction transistor (p-BJT) and a pre-driver n-type bipolar junction transistor (n-BJT), each having a base, a collector and an emitter, the bases of the pre-driver p-BJT and the pre-driver n-BJT coupled together to form the input of the pre-driver circuitry, and the emitters of the pre-driver p-BJT and the pre-driver n-BJT coupled to the control terminals of the first and second signal-conveyance transistors, respectively.

12. A circuit comprising:

a compensation node;

a first signal mirror, including first and second mirror transistors, each having a control terminal and first and second current terminals, the control terminals of the first and second mirror transistors and the second current terminal of the first mirror transistor coupled together to form a first terminal of the first signal mirror, and the second current terminal of the second mirror transistor forming a second terminal of the first signal mirror, a second signal mirror, including third and fourth mirror transistors, each having a control terminal and first and second current terminals, the control terminals of the third and fourth mirror transistors and the second current terminal of the third mirror transistor coupled together to form a first terminal of the second signal mirror, and the second current terminal of the fourth mirror transistor forming a second terminal of the second signal mirror;

a first compensation capacitor coupled between the compensation node and the first current terminal of the first mirror transistor; and a second compensation capacitor coupled between the compensation node and the first current terminal of the third mirror transistor.

13. The circuit of claim 12, further comprising:

a first compensation resistor coupled in series with the first compensation capacitor; and a second compensation resistor coupled in series with the second compensation capacitor.

14. The circuit of claim 12, wherein:

the first signal mirror further comprises a first resistor coupled between a first supply terminal and the first current terminal of the first mirror transistor; and the second signal mirror further comprises a second resistor coupled between a second supply terminal and the first current terminal of the third mirror transistor.

15. The circuit of claim 14, wherein the circuit is configured such that, a first effective impedance in series with the first compensation capacitor decreases as a first local feedback current in the first signal mirror increases and a second effective impedance in series with the second compensation capacitor decreases as a second local feedback current in the second signal mirror increases.

16. An amplifier comprising:

pre-driver circuitry;

a compensation node;

a first feedback loop extending from an output of the amplifier, through a resistive element coupled to the output of the amplifier, through a first current path in a first signal mirror having first and second terminals, and through a first output driver of the amplifier;

a second feedback loop extending from the output of the amplifier, through the resistive element, through a second current path in a second signal mirror having first and second terminals, and through a second output driver of the amplifier;

feedforward circuitry including a feedforward driver coupled to the pre-driver circuitry, the driver having an output, the feedforward circuitry further including a first feedforward capacitor coupled between the output of the feedforward driver and a first control terminal of the first output driver, and a second feedforward capacitor coupled between the output of the feedforward driver and a second control terminal of the second output driver; and first and second compensation capacitors, the first compensation capacitor coupled between the compensation node and an input-degeneration node of the first signal mirror, and the second compensation capacitor coupled between the compensation node and an input-degeneration node of the second signal mirror.

17. The amplifier of claim 16, further comprising:

first and second biasing transistors coupled in series to form an impedance element that is coupled to the first and second control terminals of the first and second output drivers.

18. The amplifier of claim 17, further comprising:

a first resistive element coupled between a second current terminal of the first output driver and the input-degeneration node of the first signal mirror; and a second resistive element coupled between a second current terminal of the second output driver and the input-degeneration node of the second signal mirror, wherein first current terminals of each of the first and second output drivers are coupled together to form an output of the amplifier.

19. The amplifier of claim 18, further comprising:

a preceding stage including a transconductance element having a voltage input and a current output coupled to the compensation node.

20. The amplifier of claim 19, wherein the preceding stage further includes a static compensation capacitor coupled between the compensation node and small-signal ground.

21. The amplifier of claim 20, further comprising:

a first compensation resistor coupled in series with the first compensation capacitor; and a second compensation resistor coupled in series with the second compensation capacitor.

22. The amplifier of claim 16, wherein the amplifier is configured such that:

an impedance of the first compensation capacitor varies with a level of a first feedback current through the first signal mirror; and an impedance of the second compensation capacitor varies with a level of a second feedback current through the second signal mirror.

23. The amplifier of claim 16, wherein the amplifier is configured such that:

the first and second compensation capacitors operate to adjust a frequency response of the amplifier in response to change in a feedback current.

* * * * *